United States Patent
Mori (10) Patent No.: US 8,487,630 B2
(45) Date of Patent: Jul. 16, 2013

(54) BATTERY PACK AND METHOD FOR DETECTING DEGRADATION OF BATTERY

(75) Inventor: Yasushi Mori, Fukushima (JP)

(73) Assignee: Sony Corporation, Tokyo (JP)

( * ) Notice: Subject to any disclaimer, the term of this patent is extended or adjusted under 35 U.S.C. 154(b) by 469 days.

(21) Appl. No.: 12/899,100

(22) Filed: Oct. 6, 2010

(65) Prior Publication Data

US 2011/0084702 A1    Apr. 14, 2011

(30) Foreign Application Priority Data

Oct. 14, 2009  (JP) ................. P2009-237637
Jul. 29, 2010  (JP) ................. P2010-170138

(51) Int. Cl.
*G01N 27/416*  (2006.01)

(52) U.S. Cl.
USPC ........... 324/430; 324/426; 324/427; 324/432; 324/433; 324/434; 702/63; 320/116; 320/161

(58) Field of Classification Search
USPC ............. 324/430, 429, 432, 433, 434; 702/63
See application file for complete search history.

(56) References Cited

U.S. PATENT DOCUMENTS

| | | | |
|---|---|---|---|
| 6,040,685 A * | 3/2000 | Tsenter et al. | 320/160 |
| 6,417,646 B1 * | 7/2002 | Huykman et al. | 320/122 |
| 6,661,202 B2 | 12/2003 | Arai | |
| 2008/0054908 A1 | 3/2008 | Suzuki | |

FOREIGN PATENT DOCUMENTS

| | | |
|---|---|---|
| JP | 3930777 | 3/2007 |
| JP | 2008-041280 | 2/2008 |

\* cited by examiner

*Primary Examiner* — Patrick Assouad
*Assistant Examiner* — Alexander J Nemtzow
(74) *Attorney, Agent, or Firm* — K&L Gates LLP (57) ABSTRACT

A battery pack includes: one or two or more secondary batteries; a charge control switch that turns on/off a charging current to the secondary battery; a discharge control switch that turns on/off a discharging current from the secondary battery; a current-detecting element for detecting the charging current and the discharging current; a voltage measuring part that measures the voltage of the secondary battery; a control unit that controls the charge control switch and the discharge control unit; and a storage unit that stores an initial internal resistance of the secondary battery. The control unit measures a closed circuit voltage and a charging current during charging, and a first closed circuit voltage after a first waiting time and a second closed circuit voltage after a second waiting time. The second waiting time is longer than the first waiting time.

13 Claims, 6 Drawing Sheets

BATTERY PACK AND METHOD FOR DETECTING DEGRADATION OF BATTERY

CROSS REFERENCES TO RELATED APPLICATIONS

The present application claims priority to Japanese Priority Patent Application JP 2009-237637 filed in the Japan Patent Office on Oct. 14, 2009 and Japanese Priority Patent Application JP 2010-170138 filed in the Japan Patent Office on Jul. 29, 2010, the entire content of which is hereby incorporated by reference.

BACKGROUND

The present application relates to a battery pack and a method for detecting the degradation of a battery. In particular, the present application relates to a battery pack that can detect more correctly the degradation level of a degraded battery and a method for detecting the degradation level of a battery.

In recent years, battery packs using lithium ion secondary batteries have been widely used as power sources for electronic mobile apparatuses, such as note-type personal computers, mobile phones, and personal digital assistants (PDAs), and high power apparatuses, such as in-vehicle apparatuses and electric power tools. A lithium ion secondary battery has advantageous features, such as light weight, high capacity, ease of remaining capacity detection, and long cycle life.

A battery pack is a consumable. Secondary battery housed in the battery pack will be degraded by an increase in number of times used, and time-dependent degradation caused by leaving it standing for a long period. Thus, the more the secondary battery degrades, the more the available time of the secondary battery, which is from a fully charged state to a discharged state, decreases. For this reason, it is desirable to detect correctly the available time and capacity of a battery, which change with use or nonuse, and display a remaining capacity on an electronic apparatus. The electronic apparatus is typically designed to inform the user of the remaining capacity of a battery pack or an internal battery with a display screen, a lamp, or the like. If there is a large difference between the actual remaining capacity and the detected remaining capacity (i.e., remaining capacity of which the user is notified), problems may be caused. For example, the electronic apparatus in use is suddenly powered off. In addition, the amount of charge decreases as a result of being determined as a full charge in spite of without reaching to a fully charged state.

To determine the internal resistance of a secondary battery has been known in the art, there is a common method that calculates a direct current (DC) resistance from a voltage difference between a closed circuit voltage (CCV) and an open circuit voltage (OCV) and a current value in a closed circuit state.

For example, Japanese Unexamined Patent Application Publication No. 2008-41280 discloses a method for measuring the degradation degree of a secondary battery. That is, after the user repeats the charge of a secondary battery ten or more times by turning the charge on/off, an open circuit voltage is measured in a state where the charge of the battery is turned off. Then, the degradation degree of the secondary battery is calculated using the measured open circuit voltage together with both a previously measured closed circuit voltage and a charging current value.

Japanese Patent No. 3930777 also discloses a method for measuring the degradation degree of a secondary battery. That is, the net resistance value of a secondary battery is calculated from a discharging current periodically measured during a period of the flow of incoming current and a terminal voltage corresponding to the discharging current. In addition, the polarization resistance value of the battery is calculated from the discharging current and the terminal voltage and the degradation degree of the battery is then calculated using the net resistance value and the polarization resistance value.

SUMMARY

However, the application disclosed in the aforementioned Japanese Unexamined Patent Application Publication No. 2008-41280 does not consider a polarization resistance component even thought it measures the direct current (DC) resistance component of the secondary battery. Thus, a correct degradation state of the battery is hardly obtained when the battery is in a degradation mode where the polarization resistance component thereof increases.

Furthermore, the application disclosed in the aforementioned Japanese Patent No. 3930777 is designed to periodically measure a discharging current and a terminal voltage in a period as short as several milliseconds where an incoming current is monotonously decreased from its peak value to a steady state value. Thus, such a measurement typically uses an A/D converter with a high-speed conversion time, so that the apparatus will become an expensive one. More specifically, for example, the current measurement cycle of an A/D converter installed in a typical battery pack is in a unit range of several tens to several hundreds milliseconds, so that such an A/D converter is hardly employed. Furthermore, if the battery pack is used without the flow of incoming current, for example the battery pack is used in a personal note computer or the like where the charge and discharge of the battery are repeated, the method disclosed in the aforementioned Japanese Patent No. 3930777 hardly measure any resistance value.

Therefore, it is desirable to provide a battery pack and a method for detecting the degradation degree of a battery, where the degradation degree of a battery in which the degradation thereof is progressed with an increase in polarization resistance component can be detected more correctly.

According to a first embodiment, a battery pack includes: one or two or more secondary batteries; a charge control switch that turns on/off a charging current to the secondary battery; a discharge control switch that turns on/off a discharging current from the secondary battery; a current-detecting element for detecting the charging current and the discharging current; a voltage measuring part that measures the voltage of the secondary battery; a control unit that controls the charge control switch and the discharge control unit; and a storage unit that stores an initial internal resistance of the secondary battery. In this battery pack, the control unit measures a closed circuit voltage and a charging current during charging, and a first open circuit voltage after a first waiting time and a second open circuit voltage after a second waiting time elapsed from turning off the discharge control switch immediately following the measurement of the closed circuit voltage, where the second waiting time is longer than the first waiting time. Also, the control unit calculates a DC resistance component from the charging current and a voltage difference between the closed circuit voltage and the first open circuit voltage. In addition, the control unit calculates a polarization resistance component from the charging current and a voltage difference between the first open circuit voltage and the second open circuit voltage. In the battery pack, the control unit further calculates a degradation degree of the secondary battery by subtracting the initial internal resistance from the sum of the DC current resistance component and the polarization resistance component.

According to a second embodiment, a method for calculating the degradation degree of a battery includes measuring a closed circuit voltage and a charging current during charging, a first open circuit voltage after a first waiting time elapsed from shutting off the charging current, and a second open circuit voltage after a second waiting time elapsed, where the second waiting time is longer than the first waiting time; calculating a voltage difference between a DC resistance component from the charging current and a voltage difference between the closed circuit voltage and the first open circuit voltage. The method also includes calculating a polarization resistance component from the charging current and a voltage difference between the first open circuit voltage and the second open circuit voltage. The method further includes calculating a degradation degree of the secondary battery by subtracting the initial internal resistance from the sum of the DC current resistance component and the polarization resistance component.

In an embodiment, the degradation degree of the battery using both a direct resistance component obtained by measurement of a closed circuit voltage immediately after stopping a charging current and a polarization resistance component obtained by measurement of an open circuit voltage after a brief interval from the stop of the charging current. In this case, it is preferable to carry out the measurement of a closed circuit voltage during charging when the maximum battery voltage of secondary battery is larger than the rated voltage of secondary battery. In addition, it is preferable to carry out the measurement of an open circuit voltage within two seconds from the break of a charging current. It is also preferable to carry out the measurement of an open circuit voltage after a brief interval from the stop of the charging current after five or more seconds from the break of the charging current. Therefore, such a configuration of the battery pack leads to a correct detection of the resistance component of the degraded battery.

According to an embodiment, the degradation degree of a battery is calculated using a polarization resistance component obtained by a measurement after a brief interval from the stop of a charging current in addition to a DC resistance component. Thus, even if the DC resistance components of batteries with different degradation degrees are similar to each other, the degradation degrees of these batteries can be detected correctly.

Additional features and advantages are described herein, and will be apparent from the following Detailed Description and the figures.

DETAILED DESCRIPTION

The present application will be described below with reference to the figures according to an embodiment.

(1) Cycle Degradation Battery and Time-Dependent Degradation Battery

Hereinafter, the term "cycle degradation" refers to the degradation of a battery depending on the number of cycles of charge-and-discharge and the term "time-dependent degradation" refers to the degradation of a battery after an extended period of leaving the battery unused.

Hereafter, the difference between the cycle degradation battery and the time-dependent battery with respect to their characteristic features will be described.

Figure 1A:
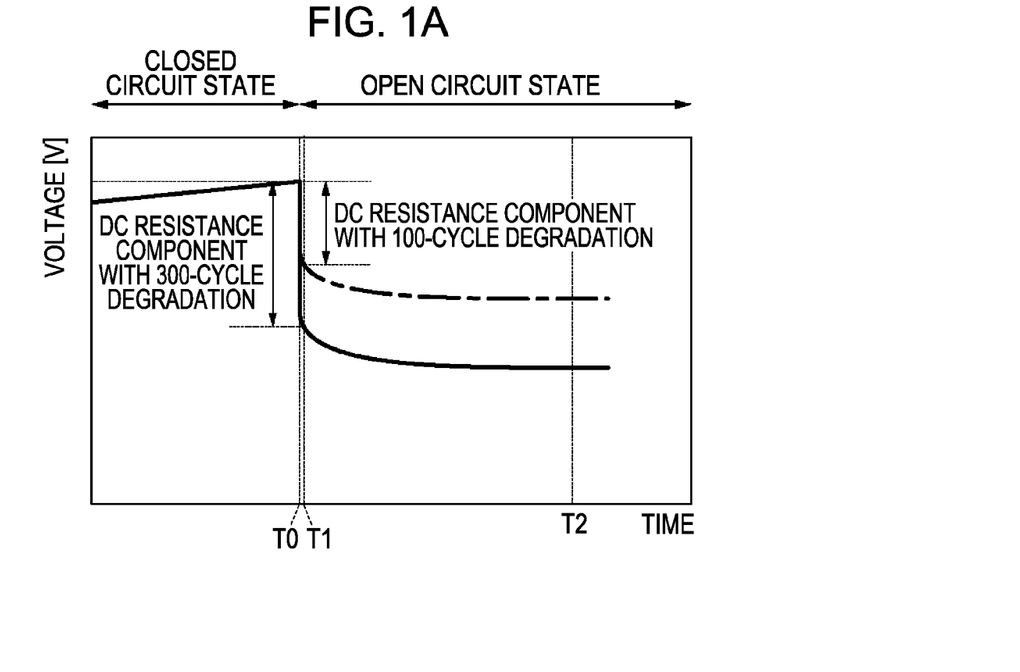
FIG. 1 is a graphic diagram illustrating the charge waveforms of batteries with difference numbers of cycles and the charge waveforms of cycle-degradation and time-dependent degradation batteries with substantially the same DC resistance component.
Figure 1B:
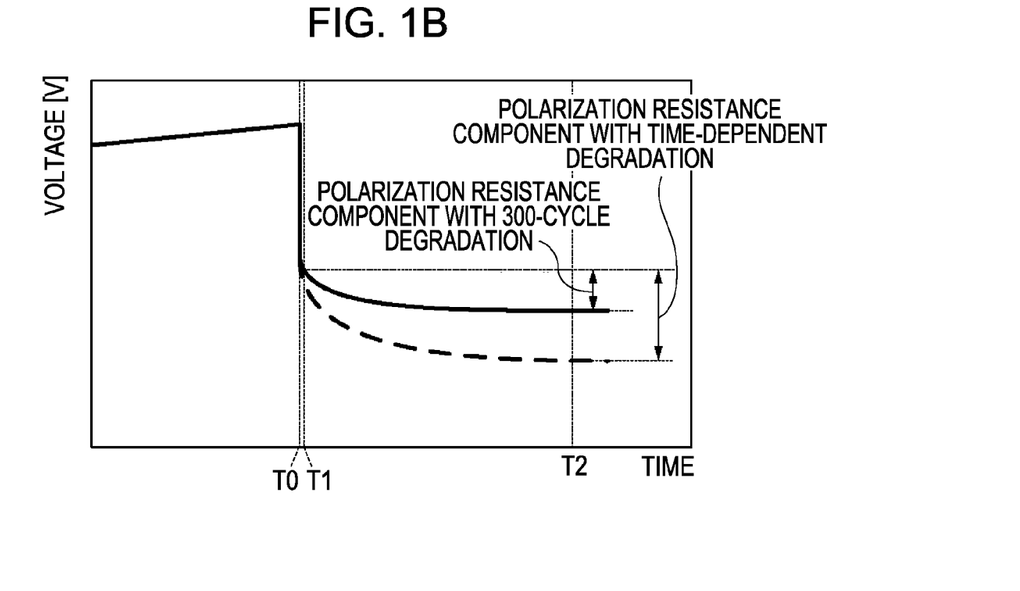

In FIG. 1A, the charge waveform of a battery after 100 cycles of charge-and-discharge is represented by a dashed line and the charge waveform of a battery after 300 cycles of charge-and-discharge is represented by a solid line. The charging waveforms represented by the dashed line and the solid line show drastic voltage drops when changing from a closed circuit state to an open circuit state due to a direct current (DC) resistance component under 100-cycle degradation and a DC resistance component under 300-cycle degradation, respectively. In FIG. 1B, the charging waveform of a battery after 300 cycles of charge-and-discharge is represented by a solid line and the charging waveform of a time-dependent degradation battery that shows substantially the same voltage drop due to a DC resistance component as that of the battery after 300 cycles of charge-and-discharge. Each of the charging waveforms of FIGS. 1A and 1B can be obtained as follows:

First, the secondary battery was produced.

[Production of Positive Electrode]

A positive electrode mixture was prepared by mixing 96% by weight of cobalt acid lithium ($LiCoO_2$) as a positive active material, 1% by weight of ketjen black as a conductive agent, and 3% by weight of polyvinylidene fluoride (PVdF). Next, the positive electrode mixture was dispersed in N-methyl-2-pyrrolidone to obtain a positive electrode mixture slurry. Subsequently, the positive electrode mixture slurry was uniformly applied to a positive electrode collector made of aluminum (Al) foil and then dried, followed by being subjected to compression molding with a roll presser at a constant pressure to obtain a belt-like positive electrode.

[Production of Negative Electrode]

A negative electrode mixture was prepared by mixing 94% by weight of graphite with 6% by weight of polyvinylidene fluoride (PVdF) as a binder. Next, the negative electrode mixture was dispersed in N-methyl-2-pyrrolidone to obtain a negative electrode mixture slurry. Subsequently, the negative electrode mixture slurry was uniformly applied to a negative pole collector made of copper (Cu) foil and then dried, followed by being subjected to compression molding with a roll presser at a constant pressure to obtain a belt-like negative electrode.

[Assembly of a Secondary Battery]

The belt-like positive electrode and the belt-like negative electrode prepared as described above were laminated via a separator made of a microporous polyethylene film of 20 μm in thickness and rolled up to prepare a spiral type rolled electrode body. Next, electric insulating plates were mounted on the upper and lower sides of the rolled electrode body and then placed in a nickel-plated iron battery can. Then, a positive electrode lead made of aluminum was drawn from the positive electrode collector and then welded to a battery lid. In addition, a negative electrode lead made of nickel is drawn from a negative pole collector made of nickel and then welded to the battery can.

Subsequently, lithium hexafluorophosphate ($LiPF_6$) was added to an electrolytic solution, which was prepared by mixing ethylene carbonate (EC) with dimethyl carbonate (DMC) (1:1 in volume) in the battery can so as to be adjusted to a volume of 1 mol/l. Next, the battery can was caulked via a gasket having an asphalt-coated surface to fix a safety valve mechanism having a current shut-off mechanism, a heat sensitive resistance element, and a battery lid to keep the inside of the battery airtight. As a result, a cylindrical lithium ion secondary battery with a diameter of 18 mm and a height of 65 mm was prepared.

The batteries produced as described above were placed under different conditions. That is, one battery was subjected to 100 cycles of charge and discharge, another battery was subjected to 300 cycles of charge and discharge. In addition, a still another battery was degraded by left standing at a high temperature in a completely charged state so that the DC resistance thereof can reach to the same level as that of the battery subjected to 300 cycles of charge and discharge.

[Measurement of Charging Waveform]

These batteries were independently charged. The charge was stopped when the conditions of a battery voltage of more than 4.0 V and a charging current of more than 1.0 A. Subsequently, the voltage waveform of each battery was measured.

As shown in FIG. 1A, the batteries subjected to different cycles of charge and discharge showed that the more the number of cycles increases the more the voltage of the battery at the time of shutting off the charging current decreases (i.e., the more the DC resistance of the battery increases). On the other hand, the voltage of the battery further decreases as a predetermined time passes after shutting off the charging current. In other words, the degree of cycle degradation was influenced on the DC resistance component.

In contrast, as shown in FIG. 1B, there is a large difference between the cycle degradation battery and the time-dependent degradation battery with respect to a drop in voltage after a predetermined time from the shut off of the charging current even when the DC resistance components of the respective batteries are substantially equal to each other. Therefore, if the degradation degree of each battery was calculated only based on the DC resistance component thereof, the cycle degradation battery and the time-dependent degradation battery would show substantially the same degradation degree. Therefore, although actual full charge capacities of these batteries are different from each other, the complete charge capacities calculated using the degradation degree would be substantially the same.

In this embodiment, therefore, the degradation degree of the battery was calculated with reference to both the DC resistance component and the polarization resistance component which will cause a large drop in voltage after shut off of the charging current to obtain a more correct degradation degree of the battery. Hereafter, the battery pack and the method for detecting the degradation of the battery according to embodiments of the present application will be described.

(2) Configuration of Battery Pack (2-1) Circuit Configuration of Battery Pack

Figure 2:
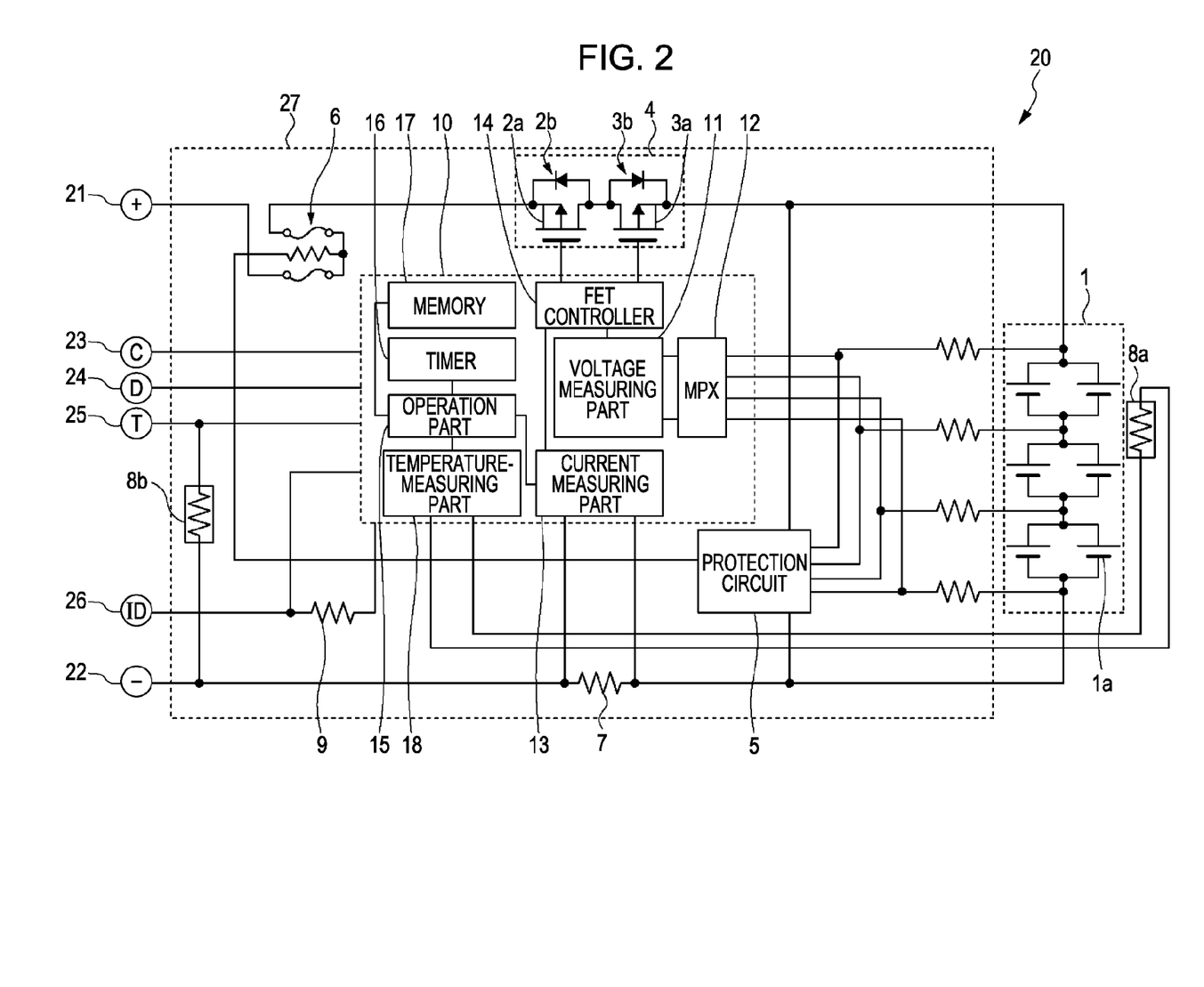
FIG. 2 is a circuit diagram illustrating an exemplary circuit configuration of a battery pack according to an embodiment.

FIG. 2 is a block diagram illustrating the circuit configuration of a battery pack according to an embodiment. The battery pack includes an assembled battery 1, a switching unit having a charge-control field effect transistor (charge-control FET) 2a and a discharge-control field effect transistor (discharge-control FET), a protection circuit 5, a fuse 6, a current detecting resistor 7, temperature detecting elements 8a and 8b, and a central processing unit (CPU) 10, where the CPU 10 serves as a control unit.

The battery pack further includes a positive electrode terminal 21 and a negative electrode terminal 22. When charging, the positive electrode terminal 21 and the negative electrode terminal 22 are respectively connected to the positive electrode terminal and the negative electrode terminal of a charger to carry out charging. During the use of an electronic apparatus, the positive electrode terminal 21 and the negative electrode terminal 22 of the battery pack are respectively connected to the positive electrode terminal and the negative electrode terminal of the electronic apparatus to carry out discharging.

Here, structural components are collectively arranged on a circuit board 27, excepting the assembled battery 1 and the temperature detecting element 8a placed near the assembled battery 1.

The assembled battery 1 includes a plurality of secondary batteries 1a connected in series and/or in parallel. Here, the secondary batteries 1a are lithium ion secondary batteries. In FIG. 2, there is shown an example where six secondary batteries 1a are connected to one another, two in parallel and three in series (so-called 2p3s configuration).

The switching unit 4 includes the charge-control FET 2a and a parasitic diode 2b, thereof, the discharge-control FET 3a and a parasitic diode 3b thereof. The switching unit 4 is under the control of the CPU 10. In other words, the parasitic diode 2b exists between the drain and the source of the charge control FET 2a. The parasitic diode 3b exists between the drain and the source of the discharge control FET 3a. The parasitic diode 2b has a backward polarity with respect to charging current flowing in the direction from the positive terminal 21 to the assembled battery 1, and a forward polarity with respect to discharging current flowing in the direction from the negative terminal 2 to the assembled battery 1. The parasitic diode 3b has a forward polarity with respect to the charging current, and a backward polarity with respect to the discharging current.

The charge-control FET 2a is turned off when the battery voltage turns into an overcharge detection voltage and then controlled by the CPU 10 to prevent the current path of the assembled battery 1 from the passage of charging current. Here, after turning off the charge-control FET 2a, only the discharge is allowed through the parasitic diode 3a. Furthermore, when the charge-control FET 2a is turned off when a large amount of current flows, the CPU 10 controls the charge-control FET 2a to shut off charging current flowing into the current path of the assembled battery 1.

The discharge-control FET 2b is turned off when the battery voltage turns into an over-discharge detection voltage and then controlled by the CPU 10 to prevent the current path of the assembled battery 1 from the passage of discharging current. Here, after turning off the discharge-control FET 2b, only the charge is allowed through the parasitic diode 3b. Furthermore, when the discharge-control FET 2b is turned off when a large amount of current flows, the CPU 10 controls the discharge-control FET 2b to shut off discharging current flowing into the current path of the assembled battery 1.

The protection circuit 5 measures the voltages of the assembled batteries 1 and the respective secondary batteries 1a thereof. Then, the protection circuit 5 blows out the fuse 6 when the measured voltage exceeds a predetermined voltage. In other words, the protection circuit 5 blows out the fuse 6 without control of the CPU 10. Therefore, the current can be shut off even if the CPU 10 causes any trouble and does not control the charge-control FET 2a when the measured voltage is equal to or more than a predetermined voltage.

The temperature detector 8a may be a thermistor or the like and placed near a plurality of secondary batteries 1a. The temperature detector 8a measures the temperature of the assembled battery 1 and then supplies the measured temperature to the CPU 10. The temperature detector 8b may be a thermistor or the like. The temperature detector 8b measures the temperature of the inside of the battery pack and then supplies the measured temperature to an electronic apparatus connected with the battery pack via a connection terminal 25.

The identification resistor 9 allows the electronic apparatus connected with the battery pack via the connection terminal 26 to determine the type of the battery pack and connection availability between the battery pack and the electronic apparatus.

For example, the CPU 10 may include a voltage measuring part 11, a multiplexer (MPX) 12, a current measuring part 13, a FET controller 14, an operation part 15, a timer 16, a memory 17, and a temperature measuring part 18. The CPU 10 controls each part using a random access memory (RAM) (not shown) as a work memory according to a program previously stored in a read only memory (ROM) (not shown).

The voltage measuring part 11 measures the voltages of the assembled battery 1 and the respective secondary batteries 1a thereof and then A/D converts the measured voltage, followed by supplying the A/D converted voltage to the FET controller 14 and the operation part 15. At this time, the multiplexer (MPX) 12 determines which secondary battery is subjected to the measurement of voltage. The current measuring part 13 measures current using the current detecting resistor 7 and then supplies the measured current to the CPU 2. Subsequently, the CPU 2 sends the measured current to the FET controller 14 and the operation part 15.

The FET controller 14 controls the charge-control FET 2a and the discharge-control FET 3a of the switching unit 4 based on the voltage and the current which are respectively entered from the voltage measuring part 11 and the current measuring part 13. If the voltage of any of the secondary batteries 1a becomes an overcharge detection voltage or an over-discharge detection voltage or less or a sudden flow of a large amount of current occurs, the FET controller 14 sends a control signal to the switching unit 4 to prevent the secondary battery from being overcharged or over-discharged. Here, in the case of a lithium ion secondary battery, the overcharge detection voltage is determined as 4.20 V±0.05 V, and the over-discharge detection voltage is determined as 2.4 V±0.1 V.

The FET controller 14 supplies a control signal DO to the charge-control FET 2a and also supplies a control signal CO to the discharge-control FET 3a.

In each of the usual charge operation and the usual discharge operation, the discharge FET 3a is turned into an ON state while the control signal CO is set to a logic "L" level (hereinafter, suitably referred to as a low level). Furthermore, the control signal DO is set to the low level to turn the charge-control FET 2a into an ON state. In FIG. 2, each of the charge-control FET 2a and the discharge control FET 3a is a P-channel type. Thus, it is turned on using a gate potential which is a predetermined level or more lower than a source potential. In other words, in the usual charge operation and the usual discharge operation, the control signals CO and DO are set to low levels to turn the charge-control FET 2a and the discharge-control FET 3a into ON states, respectively. Furthermore, for example, when overcharge or over-discharge occurs, the control signals CO and DO are set to high levels to turn the charge-control FET 2a and the discharge-control FET 3a into OFF states, respectively.

The operation part 15 calculates the degradation degree of a battery at a predetermined time measured by a timer 16 based on a voltage and a current measured and inputted by the voltage measuring part 11 and the current measuring part 13 Calculation of the degradation degree of the operation part 15 will be described later.

The memory 17 may be a non-volatile memory, such as an electrically erasable and programmable read only memory (EEPROM). The memory 17 previously stores numerical values calculated by the operation part 15, an inner battery resistance value of each secondary battery 1a in an initial state measured at the stage of a production process, and so on. In addition, the memory 17 may store a complete charge capacity of the secondary battery 1a and may replace it with a complete charge capacity obtained on the basis of the latest degradation degree calculated every time a cycle of charge and discharge is carried out.

In the temperature measuring part 18, the temperature of the battery is measured using a temperature detecting element 8a, followed by carrying out a charge and discharge control when abnormal heat generation occurs or correcting the measurement of a remaining capacity if necessary.

(2-2) Method for Detecting Degradation of Battery

Figure 3:
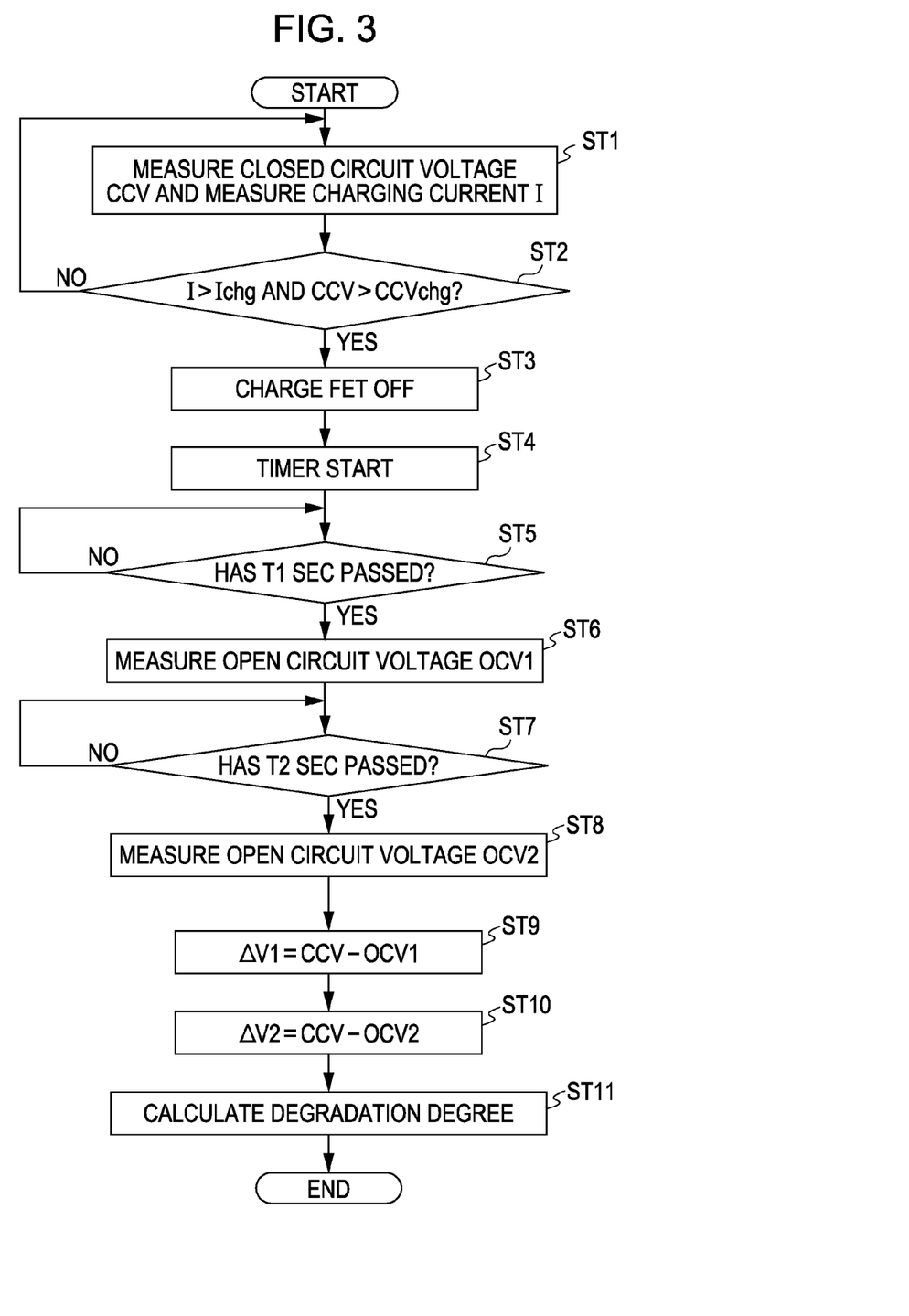
FIG. 3 is a flow chart illustrating a method for calculating the degradation degree of a battery according to an embodiment.

A method for determining the degradation degree of a battery according to an embodiment will be described. The calculation of degradation degree is carried out by the operation part 15 of the CPU 10. Hereinafter, the method for determining the degradation degree of a battery will be described with reference to the flow chart shown in FIG. 3. Specifically, the flow chart of FIG. 3 is provided for determining the degradation state of a battery by turning the charge-control FET 2a from ON to OFF during charging.

First, as shown in step ST1, the closed circuit voltage CCV and charging current I of the secondary battery 1 a are measured during charging. Simultaneously, in the CPU 10, the multiplexer 12 chooses each of the secondary batteries 1a. Then, the voltage measuring part 11 measures the voltages of the respective secondary batteries 1a. The current measuring part 13 calculates a charging current using the current detecting resistor 7. If necessary, furthermore, the temperature T of the assembled battery 1 (secondary batteries 1a) is measured using the temperature detecting element 8a. The measurement of the closed circuit voltage CCV and charging current I in step ST1 is performed for every predetermined time. Here, like the detection of complete charge of the secondary battery 1a, the measurement of closed circuit voltage CCV is preferably performed in a situation where the state of a battery becomes stable.

Next, in step ST2, it is determined whether the closed circuit voltage CCV measured in step ST1 is larger than a predetermined threshold CCVchg and the charging current I is larger than a predetermined threshold Ichg. In step ST2, if the conditions of "the closed circuit voltage CCV>CCVchg" and "the charging current I>Ichg" are not satisfied, the process returns to step ST1 and then carries out the measurement of the closed circuit voltage CCV and charging current I for every predetermined time. This is because of a difficult in securement of the accuracy of the measurement as a result of a decrease in voltage difference between the closed circuit voltage CCV and the open circuit voltage OCV when the charging current I is small. Therefore, it is preferable that the charging current I is 0.1 C mA or more. Furthermore, if the closed circuit voltage CCV is low, a variation in amount of a drop in voltage increases when measuring the open circuit voltage OCV. Thus, the above measurement becomes unstable. Furthermore, the above measurement becomes unstable because the internal resistance value increases in a state where the remaining capacity of the secondary battery. Therefore, it is preferable to carry out the measurement of the open circuit voltage OCV while stopping charging when the closed circuit voltage CCV is equal to or more than the average operating voltage (rated voltage).

Then, it is preferable that the voltage conditions for the measurement of the closed circuit voltage CCV to be used for calculating the degradation degree of a battery. For example, the control where the predetermined threshold CCVchg is set to 3.7 V for the first time and then set to 4.2 V for the second time is preferable from a viewpoint of stability in measurement conditions. If the first-time threshold CCVchg is 3.7 V, then the measurement is preferably carried out at a threshold CCVchg of 3.7 V for the second time or later. If the first-time threshold CCVchg is 4.2 V, then the measurement is preferably carried out at a threshold CCVchg of 4.2 V for the second time or later. Furthermore, as described above, the measurement is carried out unstably in a state where the remaining capacity of the secondary battery is low because of an increase in inner resistance value. Then, the results of the measurement can be obtained in a stable manner when the measurement of closed circuit voltage CCV to be employed in the detection of degradation degree is carried out in a state where the closed circuit voltage CCV is equal to or more than the average operating voltage (rated voltage) (i.e., the battery voltage of the secondary battery>the rated voltage of the secondary battery=the threshold CCVchg).

In step ST2, if the conditions of the closed circuit voltage CCV>CCVchg and the charging current I>Ichg is satisfied, then the process proceeds to step ST3. In step ST3, the CPU 10 controls the switching unit 4 to output a control signal to the charge-control FET 2a. In this case, the control signal is responsible for turning off the charge-control FET 2a.

Subsequently, in step ST4, the timer starts to count the time.

In step ST5, it is determined whether the count value of the timer exceeds a waiting time immediately after counting. In step ST5, the CPU 10 waits for the time of measuring an open circuit voltage OCV1 immediately after stop of current. Since the OCV1 is a DC resistance component, the measurement is desirably carried out immediately after the stop of current, preferably at a waiting time T1 of not more than two seconds. If the voltage measurement is performed immediately after the stop of current, the measured amount of voltage drop may reflect the influence of polarization component. In order to eliminate the influence of polarization component as much as possible, it is preferable to shorten the waiting time T1 as much as possible within a possible range of voltage measurement rate of hardware. In step ST5, if it is determined that the count value of the timer does not exceed the waiting time, then the timer continuously keeps counting. In step ST5, if it is determined that the count value of the timer exceeds the waiting time, then the process proceeds to step ST6.

In step ST6, an open circuit voltage OCV1 is measured. Here, the measurement of the open circuit voltage OCV1 is carried out such that the multiplexer 12 chooses each of the secondary batteries 1a and then the voltage measuring part 11 measures the voltages of the respective secondary battery 1a.

In step ST7, it is determined whether the count value of the timer exceeds a predetermined waiting time which is longer than the waiting time immediately after counting in step ST5. In step ST7, the CPU 10 waits for the time of measuring an open circuit voltage OCV2. The measurement of open circuit voltage OCV2 is desirably carried out at the time when a polarization resistance component appears in a battery voltage. The waiting time T2 is preferably five seconds or more, more preferably 10 seconds or more in consideration of stability in the measurement.

To consider the waiting time, Table 1 below represents an example of results obtained by the measurement of a change in battery voltage after the stop of charging current.

TABLE 1

| Time elapsed after stop of charge [sec] | battery voltage [mV] | amount of voltage dropped [mV] |
|---|---|---|
| 0 | 4200 | 0 |
| 1 | 4191 | 9 |
| 2 | 4190 | 10 |
| 3 | 4189 | 11 |
| 4 | 4188 | 12 |
| 5 | 4188 | 12 |
| 6 | 4188 | 12 |
| 7 | 4188 | 12 |
| 8 | 4188 | 12 |
| 9 | 4188 | 12 |
| 10 | 4188 | 12 |

As is evident from Table 1, it is found that the secondary battery causes a rapid drop in voltage during a period of 0 to 1 seconds after the stop of charging, a gradual decrease in voltage occurs during a period of 2 to 4 seconds after the stop of charging, and the voltage is stable at a time of 4 seconds or later after the stop of charging. It is preferable that the waiting time T1 is measured before the appearance of a polarization component in the voltage. Thus, the waiting time T1 is preferably set to two seconds or less. Although it is preferable that the waiting time T1 is short as much as possible, the waiting time T1 may be set to two seconds. This is because there is no much difference between the measurement value and the measurement result at one second after the stop of charging as long as the measurement value is obtained at two seconds after the stop of charging.

As is evident from the results of the measurement in Table 1, the waiting time T2 is preferably four seconds or later where the voltage is stabilized, or more preferably five seconds or more in consideration of a margin of error. In addition, since the polarization resistance component appears in the voltage of the secondary battery, the waiting time T2 is preferably set to a time as long as possible. However, under the actual use environment, there is a problem in that a charging time for complete charge is prolonged when the measurement of each of the open circuit voltage CCV, the open circuit voltage OCV1, and the open circuit voltage OCV2 is performed. Therefore, the waiting time T2 is preferably set to approximately 10 to 60 seconds. When the measurement of the present embodiment is carried out at the time of detecting a full charge, the waiting time T2 may be set to approximately 10 seconds to one hour because any consideration of the charging time for full charge is not desired.

In step ST7, if it is determined that the count value of the timer does not exceed a predetermined waiting time, then the timer continuously keeps counting. In step ST7, if it is determined that the count value of the timer exceeds the predetermined waiting time, then the process proceeds to step ST8.

In step ST8, an open circuit voltage OCV2 is measured. Here, the measurement of the open circuit voltage OCV2 is carried out such that the multiplexer 12 chooses each of the secondary batteries 1a and then the voltage measuring part 11 measures the voltages of the respective secondary battery 1a.

Then, in step ST9, the operation part 15 calculates a difference ΔV1 between the closed circuit voltage CCV and the open circuit voltage OCV1.

Here, ΔV1 is calculated from the following expression (1):

$$\Delta V1 = CCV - OCV1 \quad \text{Expression (1)}$$

In step ST10, the operation part 15 calculates a difference ΔV2 between the closed circuit voltage CCV and the open circuit voltage OCV2. Here, ΔV2 is calculated from the following expression (2):

$$\Delta V2 = CCV - OCV2 \quad \text{Expression (2)}$$

Furthermore, in step ST11, the operation part 15 calculates the degradation degree of the secondary battery 1a. Here, for example, the degradation degree is calculated from the following expression (3):

$$\text{Degradation degree} = (\Delta V1/I + \alpha(\Delta V2 - \Delta V1)/I - Rini)/Rini \quad \text{Expression (3)}$$

For example, as a result of measuring the closed circuit voltage CCV, open circuit voltage OCV1, and open circuit voltage OCV2 of the degraded battery pack, If the resulting parameters are CCV=4.00 V, OCV1=3.80 V, OCV2=3.72 V, and I=2.0 A and previously measured parameters are α=0.5 and Rini=0.07, the degradation degree of the battery can be represented as follows:

$$\text{Degradation degree} = (0.20/2.0 + 0.5 \times 0.08/2.0 - 0.07)/0.07 = 0.71$$

Here, the degradation degree an index which can be increased simultaneously with the degradation of the battery.

Here, "Rini" is a factory default internal resistance value of the secondary battery 1a and previously stored in the memory 17. In addition, correction coefficient α is the correction coefficient of a polarization resistance component and the value thereof calculated beforehand is stored in the memory. The correction coefficient value can be calculated using the following expression (4):

$$\text{Correction coefficient } \alpha = (\text{"full charge capacity of cycle degradation product"} - \text{"full charge capacity of time-dependent degradation product"})/\text{"full charge capacity of cycle degradation product"} \quad \text{Expression (4)}$$

In the expression (4), the value is obtained from the full charge capacity of a cycle-degradation battery pack and the full charge capacity of a time-dependent degradation battery pack, where these battery packs are degraded until their DC internal resistance values become equal to each other. The correction coefficient α is a correction coefficient which is used because of a difference between the reduction rate of charge capacity with respect to the increasing rate of DC resistance component and the reduction rate of discharge capacity with respect to the increasing rate of discharge capacity. The correction coefficient changes with the configuration of a battery, so that it may be defined depending on the characteristics of the battery to be used.

Here, the expression (3) calculates the degradation degree of a battery based on the factory default internal resistance. In other words, the degradation is calculated by adding (i) a product of multiplexing a DC resistance component corresponding to the amount of voltage dropped immediately after turning off the charge-control FET 2a by a predetermined coefficient to (ii) a product of multiplexing a polarization resistance component, which is obtained after a predetermined time elapsed from turning off the charge-control FET 2a, corresponding to the amount of voltage dropped immediately after turning off the charge-control FET 2a by a predetermined coefficient. Then, (iii) a factory default internal resistance is subtracted from the resulting sum total.

The degradation degree is expressed by a numerical value of 0 (zero) or more but not more than 1 (one). The more the degradation proceeds, the more the value increases. For example, the battery capacity lost by degradation can be calculated by multiplexing the full charge capacity in an initial state by the calculated degradation degree.

Since the degradation degree is in inverse proportion to the full charge capacity, the CPU 10 can update the full charge capacity stored in the memory 17 based on the calculated degradation degree. In this case, the CPU 10 corrects the degradation degree based on the temperature T measured by the temperature detecting element 8a. Then, a full charge capacity stored in the memory is updated based on the calculated degradation degree.

Furthermore, in the above exemplified calculation of the degradation degree, the measurement of each of the closed circuit voltage CCV, the open circuit voltage OCV1, and the open circuit voltage OCV2 is performed once. However, the measurement may be performed two or more times and the resulting measurement values may be then averaged, followed by calculation of degradation degree.

Furthermore, the CPU 10 may supply the calculated degradation degree to an electronic apparatus connected to the battery pack through the communication terminal 23 and the communication terminal 24. Then, the electronic apparatus, which has received the degradation degree, may display the degradation degree on the display section of a liquid crystal display device or the like on the electronic apparatus.

(3) Configuration of Battery Pack

The battery pack may have the following configuration.

(3-1) Configuration of Secondary Battery

Hereafter, an embodiment will be described with reference to the attached drawings.

Figure 4:
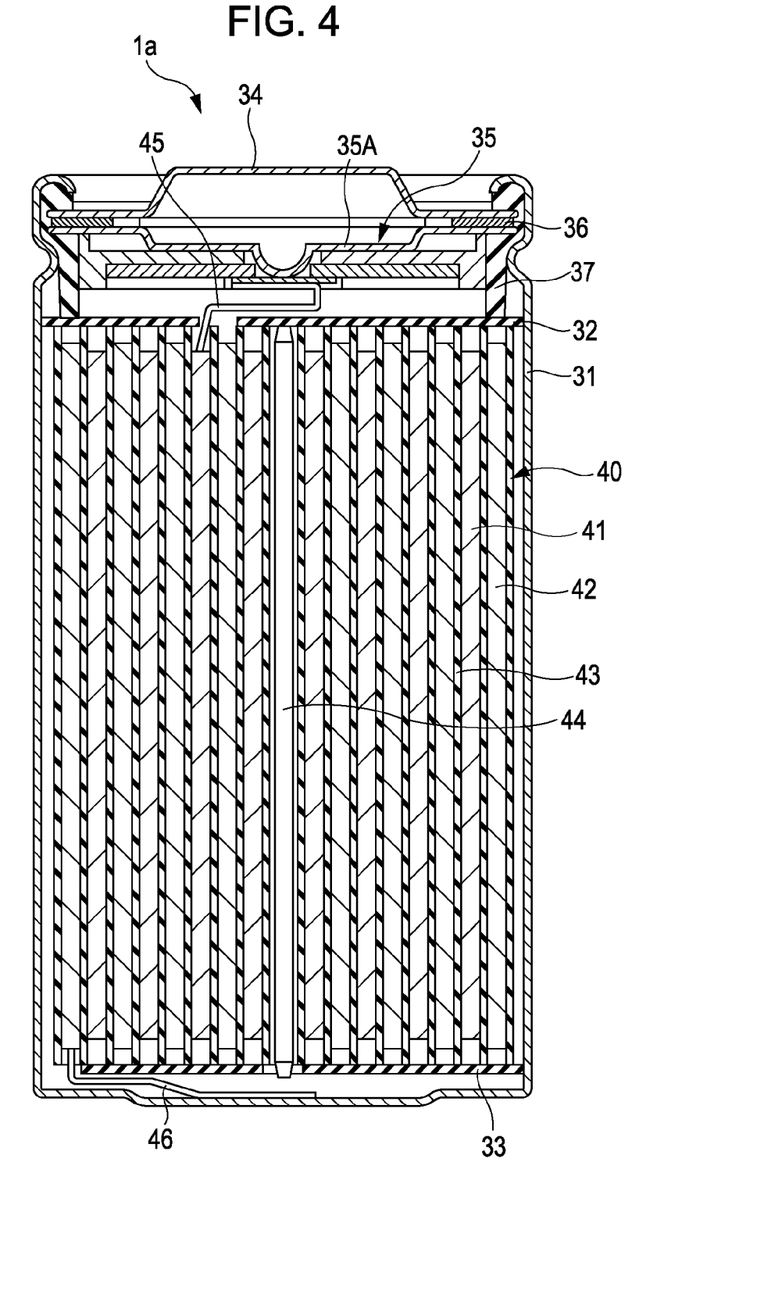
FIG. 4 is a diagram illustrating an exemplary configuration of a secondary battery to be housed in the battery pack according to the embodiment.

FIG. 4 is a cross-sectional diagram of a secondary battery according to the embodiment. Here, for example, the battery is a lithium ion secondary battery.

As shown in FIG. 4, the secondary battery is a so-called cylindrical type one having a hollow cylindrical battery can 31 that includes a wound electrode body 40 formed by winding a belt-like positive electrode 41 and a belt-like negative electrode 42 through a separator 43.

For example, the battery can 31 may be made of iron (Fe) and plated by nickel (Ni). One end of the battery can 31 is closed and the other end thereof is opened. A pair of insulating pates 32 and 33 is arranged in the inside of the battery can 31. These insulating plates 32 and 33 are perpendicular to the peripheral surface of the wound electrode body 40 so that they can sandwich the wound electrode body 40.

The open end of the battery can 31 is provided with a battery lid 34. In addition, a safety valve mechanism 35 and a heat sensitive resistance element (i.e., a positive temperature coefficient (PTC) element) 36 are mounted on the inner side of the battery lid 34. These structural components are fixed by caulking the battery can 31 through a gasket 37 so that the inside of the battery can 31 can be hermetically closed. In this case, for example, the battery lid 34 may be made of the same material as that of the battery can 31.

The safety valve mechanism 35 is electrically connected to the battery lid 34 through the heat sensitive resistance element 36. When the internal pressure of the battery becomes a predetermined level or more by internal short circuit or heating from the outside, a disk plate 35A is flipped to break an electrical connection between the battery lid 34 and the rolled electrode body 40. The heat sensitive resistance element 36 increases its resistance value when the temperature thereof increases. As a result, the flow of electricity can be restricted to prevent unusual heat generation due to high current. The gasket 37 is made of an insulating material or the like and the surface thereof is coated with asphalt.

The rolled electrode body 40 is wound around a center pin 44, for example. The positive electrode 41 of the rolled electrode body 40 is connected to a positive electrode lead 45 made of aluminum (AL) or the like. In contrast, the negative electrode 42 of the rolled electrode body 40 is connected to a negative electrode lead 46 made of nickel (Ni) or the like. The positive electrode lead 45 is welded to the safety valve mechanism 35 and thus electrically connected to the battery lid 34. In addition, the negative electrode lead 46 is welded to the battery can 31 and thus electrically connected thereto.

Figure 5:
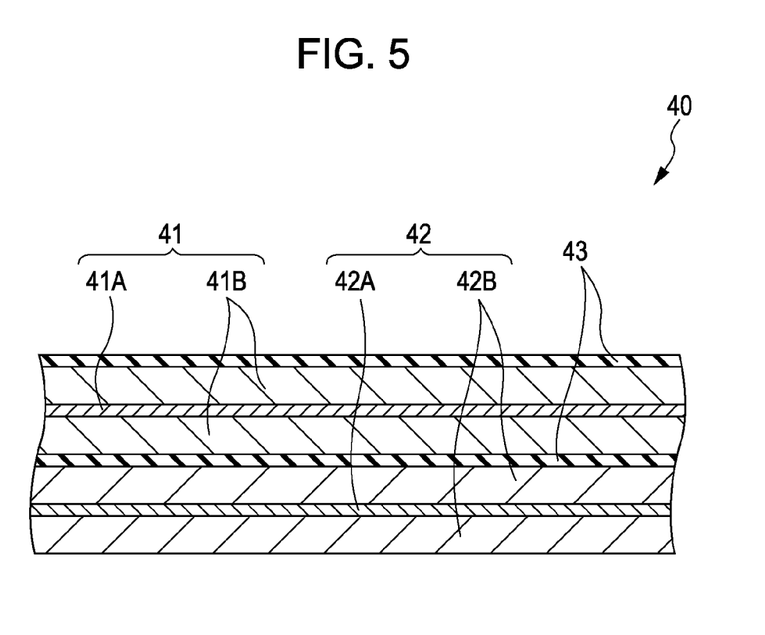
FIG. 5 is a diagram illustrating an exemplary configuration of a secondary battery to be housed in the battery pack according to the embodiment.

FIG. 5 is an enlarged view of part of the rolled electrode body 40 shown in FIG. 4.

[Positive Electrode]

The positive electrode 41 includes, for example, a positive electrode collector 41A and positive electrode active material layers 41B arranged on both sides of the positive electrode collector 41A. Alternatively, the positive electrode collector 41A may have a portion where the positive electrode active material layer 41B only exists on one side thereof. For example, the positive electrode collector 41A may be made of metal foil, such as aluminum (Al) foil.

The positive electrode active material layer 41B may include, for example, a positive active material, a conductive agent such as fibrous carbon or carbon black, and a binder such as polyvinylidene fluoride (PVdF). The positive electrode may include one or two or more positive electrode materials capable of electrochemically intercalating and deintercalating lithium (Li), an electrode reactive material, and have reaction potentials of 3 to 4.5 V against the lithium. Examples of such positive electrode materials are composite oxides including lithium. Specifically, a composite oxide of lithium and transition metal having a layered structure of lithium cobaltate ($LiCoO_2$), lithium nickelate ($LiNiO_2$), or a solid solution containing these substances ($LiNi_xCo_yMnO_z$, wherein x, y, and z are 0<x<1, 0<y<1, and 0<z<1, but x+y+z=1) can be used.

In addition, the positive electrode material may be lithium manganese oxide having a spinel structure ($LiMn_2O_4$), and a solid solution thereof ($Li(Mn_{2-v}Ni_v)O_4$, where the value of v is expressed as v<2), or the like. Alternatively, the positive electrode material may be a phosphate compound having an olivine structure such as lithium iron phosphate ($LiFePO_4$). Thereby, a high energy density can be obtained. In addition to the above materials, further examples of the positive electrode material include oxides, such as titanium oxide, vanadium oxide, and manganese dioxide; disulfides, such as iron disulfide, titanium disulfide, and molybdenum sulfide; and conductive polymers, such as sulfur, polyaniline, and polythiophene.

The conductive agent may be any of materials that impart conductivity to a positive electrode active substance when an appropriate amount of the material is mixed. Examples of such a conductive agent include carbon materials, such as carbon black and graphite. The binder may be of any of existing binders which can be typically used in a positive electrode mixture of this kind of battery. Preferably, examples of the binder include fluroresin, such as polyvinyl fluoride (PVF), polyvinylidene fluoride (PVdF), and polytetrafluoroethylene (PTFE).

[Negative Electrode]

The negative electrode 42 includes, for example, a negative pole collector 42A and negative electrode active material layers 42B arranged on both sides of the positive electrode collector 42A. Alternatively, the negative pole collector 42 may have a portion where the negative electrode active material layer 42B only exists on one side thereof. For example, the negative pole collector 42A may be made of metal foil, such as cupper (Cu) foil.

The negative electrode active material layer 42B may include, for example, a negative electrode active material and optionally any of other materials which do not contribute to charge, such as a conductive agent, a binder, or a viscosity modifier. Examples of the conductive agent include graphite fibers, metal fibers, and metal powders. Examples of the binder include fluorine-based polymer compounds, such as polyvinylidene fluoride (PVdF), and synthetic rubbers, such as styrene-butadiene rubbers (SBR) and ethylene-propylene-diene rubbers (EPDR).

The negative electrode active material may include any one or two or more of negative materials capable of electrochemically intercalating and deintercalating lithium (Li) at a potential of not more than 2.0 V against the lithium metal.

Examples of the negative electrode material capable of intercalating and deintercalating lithium (Li) include carbonaceous materials, metal compounds, oxides, sulfides, lithium nitrides such as $LiN_3$, lithium metals, metals capable of forming alloys with lithium, and polymer materials. Examples of the carbonaceous material include hardly graphitized carbon, easily graphitized carbon, artificial graphite, natural graphite, pyrolytic carbons, cokes, graphite, vitreous carbons, organic polymer compound baked materials, carbon blacks, carbon fibers and active carbon. Of these, examples of the cokes include pitch coke, needle coke and petroleum coke. The organic polymer compound baked material as referred to herein refers to a material obtained through carbonization by baking a polymer material such as phenol resins and furan resins at an appropriate temperature, and a part thereof is classified into hardly graphitized carbon or easily graphitized carbon. Also, examples of the polymer material include polyacetylene and polypyrrole.

Of these negative electrode materials capable of intercalating and deintercalating lithium (Li), those having a charge and discharge potential relatively close to a lithium metal are preferable. This is because the lower the charge and discharge potential of the negative electrode 42, the easier the attainment of a high energy density of the battery. Above all, the carbon material is preferable because a change in the crystal structure to be generated at the time of charge and discharge is very small, a high charge and discharge capacity can be obtained, and a good cycle characteristic can be obtained. In particular, graphite is preferable because its electrochemical equivalent is large, and a high energy density can be obtained. Also, hardly graphitized carbon is preferable because an excellent cycle characteristic can be obtained.

Examples of the negative electrode material capable of intercalating and deintercalating lithium (Li) include a single body, an alloy or a compound of a metal element or a semimetal element capable of forming an alloy together with lithium (Li). These materials are preferable because a high energy density can be obtained. In particular, the joint use of such a material with the carbon material is more preferable because not only a high energy density can be obtained, but an excellent cycle characteristic can be obtained. In this specification, the alloy includes alloys containing one or more kinds of metal elements and one or more kinds of semi-metal elements in addition to alloys composed of two or more kinds of metal elements. Examples of its texture include a solid solution, a eutectic (eutectic mixture), an intermetallic compound and one in which two or more kinds thereof coexist.

Examples of such a metal element or semi-metal element include tin (Sn), lead (Pb), aluminum (Al), indium (In), silicon (Si), zinc (Zn), antimony (Sb), bismuth (Bi), cadmium (Cd), magnesium (Mg), boron (B), gallium (Ga), germanium (Ge), arsenic (As), silver (Ag), zirconium (Zr), yttrium (Y) and hafnium (Hf). Examples of such an alloy or compound include those represented by a chemical formula of $Ma_fMb_gLi_h$ or a chemical formula of $Ma_sMc_tMd_u$. In these chemical formulae, Ma represents at least one member of metal elements and semi-metal elements capable of forming an alloy together with lithium; Mb represents at least one member of metal elements and semi-metal elements other than lithium and Ma; Mc represents at least one member of non-metal elements; and Md represents at least one member of metal elements and semi-metal elements other than Ma. Also, the values off, g, h, s, t, and u are values satisfied with the relationships of $f>0$, $g \geq 0$, $h \geq 0$, $s>0$, $t>0$ and $u \geq 0$, respectively.

Above all, a single body, an alloy or a compound of a metal element or a semi-metal element belonging to the Group 4B of the short form of the periodic table is preferable; and silicon (Si) or tin (Sn) or an alloy or a compound thereof is especially preferable. These materials may be crystalline or amorphous.

Furthermore, examples of the negative electrode material capable of intercalating and deintercalating lithium include oxides, sulfides and other metal compounds inclusive of lithium nitrides such as $LiN_3$. Examples of the oxide include $MnO_2$, $V_2O_5$, and $V_6O_{13}$. Besides, examples of oxides having a relatively base potential and capable of intercalating and deintercalating lithium include iron oxide, ruthenium oxide, molybdenum oxide, tungsten oxide, titanium oxide and tin oxide. Examples of sulfides include NiS and MoS.

[Separator]

Examples of the separator 43 include a polyethylene porous film, a polypropylene porous film, and a synthetic resin-made nonwoven fabric. A nonaqueous electrolytic solution, a liquid electrolyte, is impregnated in the separator 43.

[Nonaqueous Electrolyte]

The nonaqueous electrolytic solution contains a liquid solvent, for example, a nonaqueous solvent such as organic solvents, and an electrolyte salt dissolved in this nonaqueous solvent. It is preferable that the nonaqueous solvent contains at least one member of cyclic carbonates, for example, ethylene carbonate (EC), propylene carbonate (PC), and so on. This is because the cycle characteristic can be enhanced. In particular, what the nonaqueous solvent contains a mixture of ethylene carbonate (EC) and propylene carbonate (PC) is preferable because the cycle characteristic can be more enhanced.

Also, it is preferable that the nonaqueous solvent contains at least one member of chain carbonates such as diethyl carbonate (DEC), dimethyl carbonate (DMC), ethylmethyl carbonate (EMC) and methylpropyl carbonate (MPC). This is because the cycle characteristic can be more enhanced.

The nonaqueous solvent may further contain one or two or more kinds of butylene carbonate, γ-butyrolactone, y-valerolactone, compounds obtained by substituting a part or all of the hydrogen groups of such a compound with a fluorine group, 1,2-dimethoxyethane, tetrahydrofuran, 2-methyltetrahydrofuran, 1,3-dioxolane, 4-methyl-1,3-dioxolane, methyl acetate, methyl propionate, acetonitrile, glutaronitrile, adiponitrile, methoxyacetonitrile, 3-methoxypropyronitrile, N,N-dimethylformamide, N-methylpyrrolidinone, N-methyloxazolidinone, N,N-dimethylimidazolidinone, nitromethane, nitroethane, sulfolane, dimethyl sulfoxide, and trimethyl phosphate.

There may be the case where by using a compound obtained by substituting a part or all of the hydrogen atoms of a substance included in the foregoing nonaqueous solvent group with a fluorine atom, the reversibility of an electrode reaction is enhanced depending upon the electrode to be combined. In consequence, it is possible to properly use such a substance.

As the electrolyte salt, a lithium salt can be used. Examples of the lithium salt include inorganic lithium salts such as lithium hexafluorophosphate ($LiPF_6$), lithium tetrafluoroborate ($LiBF_4$), lithium hexafluoroarsenate ($LiAsF_6$), lithium hexafluoroantimonate ($LiSbF_6$), lithium perchlorate ($LiClO_4$) and lithium tetrachloroaluminate ($LiAlCl_4$); and perfluoroalkanesulfonic acid derivatives such as lithium trifluoromethanesulfonate ($LiCF_3SO_3$), lithium bis(trifluoromethanesulfonyl)imide ($LiN((CF_3SO_2)_2)$), lithium bis(pentafluoroethanesulfonyl)imide ($LiN(C_2F_5SO_2)_2$) and lithium tris(trifluoromethanesulfonyl)methide ($LiC(CF_3SO_2)_3$). These materials can be used singly or in combinations of two or more kinds thereof. Above all, lithium hexafluorophosphate ($LiPF_6$) is preferable because not only high ionic conductivity can be obtained, but the cycle characteristic can be enhanced.

Alternatively, a solid electrolyte may be used in stead of the nonaqueous electrolyte. The solid electrolyte may be any of inorganic solid electrolytes and polymer solid electrolytes so far as they have lithium ionic conductivity. Examples of the inorganic solid electrolyte include lithium nitride ($Li_3N$) and lithium iodide (LiI). The polymer solid electrolyte includes an electrolyte salt and a polymer compound. Examples of the polymer compound include ether based polymers such as poly(ethylene oxide) and crosslinked materials thereof, poly (methacrylate) ester based polymers and acrylate based polymers. Any of such polymer compounds may be used singly or copolymerized or mixed with others. Furthermore, a gel electrolyte may be used. A gel electrolyte matrix polymer may be any of polymers so far as they can be gelled by absorbing the aforementioned nonaqueous electrolyte. Example of the gel electrolyte matrix polymer include fluorine-based polymer compounds such as polyvinylidene fluoride and a copolymer of vinylidene fluoride with hexyafluoropropylene; ether-based polymers such as polyethylene oxide and crosslinked materials thereof and polyacrylonitrile. In particular, from the viewpoint of oxidation-reduction stability, a fluorocarbon polymer is preferably used for the matrix of the gel electrolyte. The gel electrolyte may be provided with ion conductivity by containing an electrolyte salt.

Such a nonaqueous electrolyte battery can obtain a significant effect of the positive electrode active substance of the present embodiment under the conditions of a maximum charge voltage of 4.25 V to 4.80 V and a minimum charge voltage of 2.00 V to 3.30 V.

(3-2) Method for Preparing Nonaqueous Electrolyte Secondary Battery

This secondary battery can be, for example, manufactured in the manner as described below.

[Method for Preparing Positive Electrode]

For example, a positive mixture is prepared by mixing a positive active material with a conductive material and a binder and then dispersed into a solvent, such as N-methylphyrrolidone to form a positive electrode mixture slurry. Subsequently, this positive electrode mixture slurry is coated on the positive electrode collector 41A, and after drying the solvent, the resultant is subjected to compression molding by a roll press or the like, thereby forming the positive electrode active material 41B. There is thus prepared the positive electrode 41.

[Method for Preparing Negative Electrode]

Also, for example, a negative electrode active material and a binder are mixed to prepare a negative electrode mixture, and this negative electrode mixture is dispersed in a solvent such as N-methylpyrrolidone to form a negative electrode mixture slurry. Subsequently, this negative electrode mixture slurry is coated on the negative electrode collector 42A, and after drying the solvent, the resultant is subjected to compression molding by a roll press or the like, thereby forming the negative electrode active material 42B. There is thus prepared the negative electrode 42.

[Assembly of Nonaqueous Electrolyte Secondary Battery]

Subsequently, a positive electrode lead 45 is installed in the positive electrode collector 41A by welding or the like. Also, a negative electrode lead 46 is installed in the negative electrode collector 42A by welding or the like. Thereafter, the positive electrode 41 and the negative electrode 42 are wound via the separator 43; a tip of the positive electrode lead 45 is welded to the safety valve mechanism 35. A tip of the negative electrode lead 46 is then welded to the battery can 31, thereby housing the wound positive electrode 41 and the negative electrode 42 in the inside of the battery can 31 while being sandwiched between a pair of insulating plates 32 and 33.

After housing the positive electrode 41 and the negative electrode 42 in the inside of the battery can 31, the foregoing electrolytic solution is injected into the inside of the battery can 31 and impregnated in the separator 23. Thereafter, the battery lid 34, the safety valve mechanism 35 and the positive temperature coefficient element 36 are fixed to the open end of the battery can 31 via the gasket 37 by caulking There can be thus manufactured the secondary battery 1a shown in FIG. 4.

(3-3) Configuration of Battery Pack

Figure 6A:
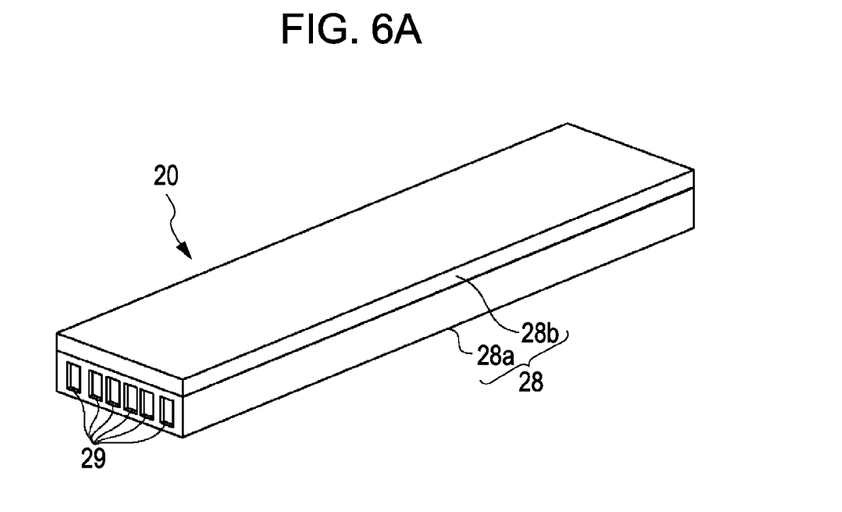
FIG. 6 is a diagram illustrating an exemplary configuration of a battery pack according to an embodiment.
Figure 6B:
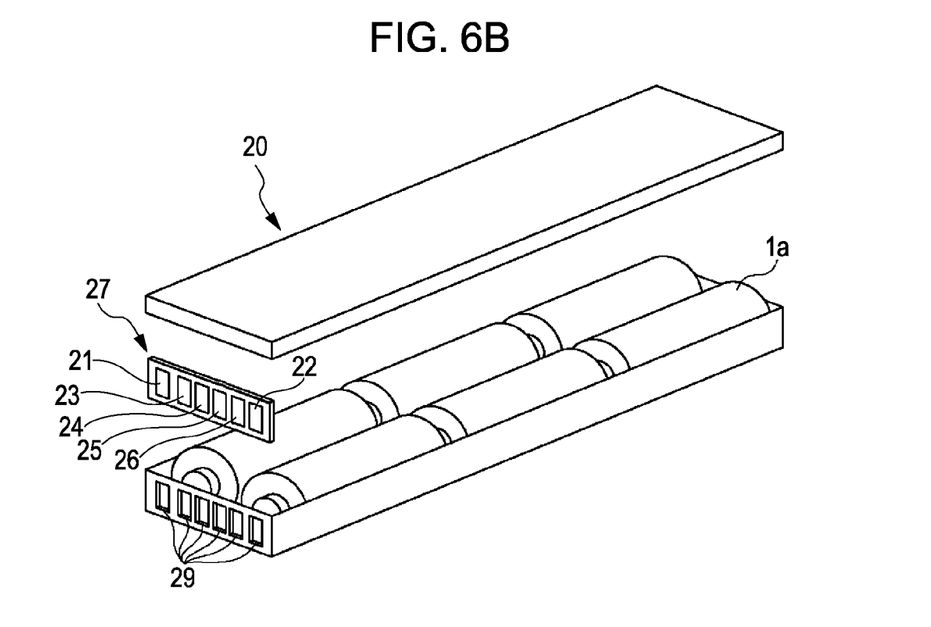

In FIG. 6, there is shown an example where six secondary batteries 1a prepared as described above are connected to one another, two in parallel and three in series (so-called 2p3s configuration), and then connected to the circuit board 27. On the circuit board 27, a charge-control FET 2a, a discharge-control FET 3a, a protection circuit 5, a fuse 6, a current detecting resistor 7, a temperature detecting element 8b, an identification resistor 9, and a CPU 10 are mounted. Furthermore, on the circuit board 27, a positive electrode terminal 21, a negative electrode terminal 22, a communication terminal 23, a communication terminal 24, a connection terminal 25, and so on are formed.

The circuit board 27 is housed together with one or more secondary batteries 1a in n external case 28, such as a resin mold case. The external case includes a lower case 28a and an upper case 28b, for example. An opening part 29 is formed in at least one of the lower case 28a and the upper case 28b. The opening part 29 is provided for exposing terminals, such as the positive electrode terminal 21, the negative electrode terminal, the communication terminal 23, the communication terminal 24, and the connection terminal 25, to the outside. When connecting the battery case to the electronic apparatus, each terminal exposed to the outside through the opening part 29 can be brought into contact with the connecting part of the electronic apparatus. Then, the battery pack is allowed to carry out charge-and-discharge and information communication with the electronic apparatus.

As described above, the present application is focused on not only a DC current component but also a polarization resistance component when measuring the degradation state of a battery pack. In this embodiment, after measuring a closed circuit voltage CCV, open circuit voltages OCV1 and OCV2 are measured at two different times when switching from the closed circuit state to the open circuit state. Subsequently, a voltage difference between the closed circuit voltage CCV and each of the open circuit voltages OCV1 and OCV2 are measured.

In the existing configuration, on the other hand, even in the case of a battery pack with different degradation states, like the cycle degradation buttery pack and the time-dependent degradation, it is mistakenly determined that the degradation states are similar to each other when the DC resistance components are equal to each other. In other words, the full charge capacity of a battery is not correctly measured when the measurement of DC resistance components is only performed. As a result, a remaining battery level is not calculated correctly. Thus, a trouble of sudden shut down of power of the apparatus may be occurred.

In this embodiment, in contrast, the full charge capacity of a secondary battery can be correctly measured because the full charge capacity is calculated using the degradation component corresponding to the polarization resistance in the calculation of degradation degree in addition to the use of DC resistance component. Therefore, it becomes possible to pull out the capacity of the secondary battery to a maximum extent. Therefore, the generation of any trouble which has been caused in the existing configuration can be prevented and a control with a high reliability can be provided. Furthermore, the above measurement becomes unstable because the internal resistance value increases in a state where the remaining capacity of the secondary battery. A stable measurement result can be obtained when the measurement of closed circuit voltage CCV is carried out in a state where the closed circuit voltage CCV is equal to or more than the average operating voltage (rated voltage) (i.e., the battery voltage of the secondary battery>the rated voltage of the secondary battery.

As described above, the embodiments of the present application has been described. However, the present application is not limited to any of the aforementioned embodiments. Various kinds of modifications are allowable based on the technical ideas.

For example, the numerical values in the respective embodiments as described above are only provided for illustrative purposes. Thus, numerical values which are different from the above numerical values may be used if necessary. Since the criteria of buttery state are different from each other depending on the type of the secondary battery, proper criteria can be determined based on the secondary battery to be used.

In the above description, the secondary battery 1a has been described using a cylindrical tube type battery as a secondary battery 1a. Alternatively, any battery in the form of one covered with a laminate film or one in the form of a rectangular battery, a coin, and a button.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:
1. A battery pack comprising:
one or two or more secondary batteries;
a charge control switch that turns on/off a charging current to said secondary battery;
a discharge control switch that turns on/off a discharging current from said secondary battery;
a current-detecting element for detecting said charging current and said discharging current;
a voltage measuring part that measures the voltage of said secondary battery;

a control unit that controls said charge control switch and said discharge control unit; and a storage unit that stores an initial internal resistance of said secondary battery, wherein said control unit measures a closed circuit voltage and a charging current during charging, and a first open circuit voltage after a first waiting time and a second open circuit voltage after a second waiting time elapsed from turning off said discharge control switch immediately following the measurement of said closed circuit voltage, where said second waiting time is longer than said first waiting time, said control unit calculates a DC resistance component from said charging current and a voltage difference between said closed circuit voltage and said first open circuit voltage, said control unit calculates a polarization resistance component from said charging current and a voltage difference between said first open circuit voltage and said second open circuit voltage, and said control unit further calculates a degradation degree of said secondary battery by subtracting said initial internal resistance from the sum of said DC current resistance component and said polarization resistance component.

2. The battery pack according to claim 1, wherein said control unit turns off said charge control switch when said closed circuit voltage during charging is equal to or exceeds the rated voltage of said secondary battery, and then measures a first open circuit voltage after a first waiting time elapsed and a second open circuit voltage after a second waiting time elapsed, where said second waiting time is longer than said first waiting time.

3. The battery pack according to claim 2, wherein
said first waiting time is not more than two seconds.

4. The battery pack according to claim 3, wherein
said second waiting time is not less than five seconds.

5. The battery pack according to claim 4, wherein
said control unit calculates said degradation degree from the following equation:

said degradation degree=(said DC resistance component+said polarization resistance component−said initial internal resistance)/said initial internal resistance.

6. The battery pack according to claim 5, wherein
said control unit calculates said degradation degree from the following equation:

said degradation degree=(said DC resistance component+correction coefficient×said polarization resistance component−said initial internal resistance)/said initial internal resistance, where said correction coefficient is calculated from the following equation:

said correction coefficient=(first full charge capacity−second full charge capacity)/first full charge capacity, based on a first full charge capacity of a secondary battery degraded by repetition of charge/discharge cycles and a second full charge capacity of a secondary battery degraded by being left standing, where the DC resistance of said secondary battery degraded by repetition of charge/discharge cycles is equal to the DC resistance of said secondary battery degraded by being left standing.

7. The battery pack according to claim 6, wherein
a full charge capacity is calculated using said degradation degree and then stored in said storage unit.

8. A method for calculating the degradation degree of a battery, comprising:

measuring a closed circuit voltage and a charging current during charging, a first closed circuit voltage after a first waiting time elapsed from shutting off said charging current, and a second closed circuit voltage after a second waiting time elapsed, where said second waiting time is longer than said first waiting time;

calculating a voltage difference between a DC resistance component from said charging current and a voltage difference between said closed circuit voltage and said first closed circuit voltage;

calculating a polarization resistance component from said charging current and a voltage difference between said first open circuit voltage and said second open voltage circuit; and calculating a degradation degree of said secondary battery by subtracting said initial internal resistance from the sum of said DC current resistance component and said polarization resistance component.

9. The method for calculating the degradation degree of a battery according to claim 8, further comprising:

turning off said charge control switch when said closed circuit voltage during charging is equal to or exceeds the rated voltage of said secondary battery; and measuring a first open circuit voltage after a first waiting time and a second open circuit voltage after a second waiting time elapsed, where said second waiting time is longer than said first waiting time.

10. The method for calculating the degradation degree of a battery according to claim 9, wherein
said first waiting time is not more than two seconds.

11. The method for calculating the degradation degree of a battery according to claim 10, wherein
said second waiting time is not less than five seconds.

12. The method for calculating the degradation degree of a battery according to claim 11, further comprising:

calculating said degradation degree from the following equation:

said degradation degree=(said DC resistance component+said polarization resistance component−said initial internal resistance)/said initial internal resistance.

13. The method for calculating the degradation degree of a battery according to claim 11, further comprising:

calculating said degradation degree from the following equation:

said degradation degree=(said DC resistance component+correction coefficient×said polarization resistance component−said initial internal resistance)/said initial internal resistance, where said correction coefficient is calculated from the following equation:

said correction coefficient=(first full charge capacity−second full charge capacity)/first full charge capacity, based on a first full charge capacity of a secondary battery degraded by repetition of charge/discharge cycles and a second full charge capacity of a secondary battery degraded by being left standing, where the DC resistance of said secondary battery degraded by repetition of charge/discharge cycles is equal to the DC resistance of said secondary battery degraded by being left standing.

* * * * *